United States Patent
Powell

(10) Patent No.: US 9,841,213 B1
(45) Date of Patent: Dec. 12, 2017

(54) VEHICLE THERMOELECTRIC COOLING SYSTEM

(71) Applicant: Daryl G. Powell, Chattanooga, TN (US)

(72) Inventor: Daryl G. Powell, Chattanooga, TN (US)

(*) Notice: Subject to any disclaimer, the term of this patent is extended or adjusted under 35 U.S.C. 154(b) by 0 days.

(21) Appl. No.: 14/883,667

(22) Filed: Oct. 15, 2015

Related U.S. Application Data

(60) Continuation-in-part of application No. 13/974,434, filed on Aug. 23, 2013, now abandoned, which is a division of application No. 13/099,436, filed on May 3, 2011, now abandoned.

(60) Provisional application No. 61/330,691, filed on May 3, 2010.

(51) Int. Cl.
    *H01L 35/30* (2006.01)
    *F25B 21/04* (2006.01)

(52) U.S. Cl.
    CPC .............. *F25B 21/04* (2013.01); *H01L 35/30* (2013.01)

(58) Field of Classification Search
    CPC .................................. H01L 35/32; H01L 35/30
    See application file for complete search history.

(56) References Cited

U.S. PATENT DOCUMENTS

| | | | |
|---|---|---|---|
| 2004/0177949 A1* | 9/2004 | Shimoya | F28F 1/022 165/152 |
| 2006/0157102 A1* | 7/2006 | Nakajima | F01N 5/025 136/205 |
| 2009/0071526 A1* | 3/2009 | Parker | F24J 1/00 136/205 |

* cited by examiner

*Primary Examiner* — Bethany L Martin
(74) *Attorney, Agent, or Firm* — Stephen J. Stark; Miller & Martin PLLC

(57) ABSTRACT

A thermoelectric cooling device has first and second sides which can act as hot and cold sides. Heat exchangers are preferably in thermal conductance with the first and second sides and air may be directed by fans past the heat exchangers. Closed fluid systems may also be used. Furthermore, improved heat sink constructions are believed to improve the efficiency of the thermoelectric device.

10 Claims, 2 Drawing Sheets

VEHICLE THERMOELECTRIC COOLING SYSTEM

CLAIM OF PRIORITY

This is a continuation in part of U.S. patent application Ser. No. 13/974,434 filed Aug. 23, 2013, which is a divisional application of U.S. patent application Ser. No. 13/099,436 filed May 3, 2011 which claims the benefit U.S. Provisional Patent Application No. 61/330,691 filed May 3, 2010, all of which are incorporated herein by reference in its entirety.

FIELD OF THE INVENTION

The present invention relates to thermoelectric cooling devices, and more particularly to a thermoelectric cooling device(s) having a magnetic field imposed thereon thereby decreasing the amount of current at a particular voltage otherwise needed to provide a desired temperature change.

DESCRIPTION OF RELATED ART

Thermoelectric also referred to as Peltier devices have been around for many years. However, as described by Wikipedia, they are typically around five to ten percent as efficient as an ideal refrigerator as compared to twenty to sixty percent which can be achieved by conventional compression based systems.

Due to these efficiency issues, thermoelectric cooling devices are typically restricted in use to solid state applications where the benefits of cooling far outweigh the additional energy requirements.

Improved efforts in efficiency of ventilation systems particularly residential, industrial, vehicle or other air handling systems including agricultural based moving equipment, cars, trucks, trains, airplanes and other air handling systems which provide a climate controlled space, heat or cool objects or spaces or believed to need an improved system which can overcome many of the prior art drawbacks which often rely on a compressed refrigerant system.

SUMMARY OF THE INVENTION

It is an object of the present invention to provide an improved magnetically assisted thermoelectric device system for use with at least one of heating and cooling.

It is another object of at least some embodiments of the present invention to provide a magnetically assisted thermoelectric device for use in conditioning air in an at least substantially confined space.

Accordingly, in accordance with a presently preferred embodiment of the present invention, at least one thermoelectric device is provided with connections to a power source. A magnetic field from a magnetic source may be intentionally induced in a cooperative manner such as providing a permanent magnet having a correct orientation relative to the thermoelectric device. The magnetic field may advantageously assist the thermoelectric device(s) providing heat transfer. The magnetic source can be preferably coupled to the thermoelectric device in terms of heat transfer as well as magnetic conductions.

Externally disposed relative to sides of the thermoelectric device and the magnetic source are preferably heat sinks or exchangers which preferably direct heat in one direction and cold in the other direction as current is provided through the thermoelectric device. As one side of the thermoelectric device is heated and the other side cooled. The magnetic field has been found to at least one of decrease the required current for a desired temperature differential and/or increase the temperature differential for a specified temperature for some embodiments. Accordingly, when providing alternating current through a rectifier, at least one capacitor, direct current voltage is regulated and can be provided to at least one thermoelectric device. Permanent or other magnets provide a magnetic field which have been found to decrease the amount of current necessary for the thermoelectric device to operate at a particular voltage in preliminary testing, figures of up to twenty percent have been seen. This corresponds to an increased efficiency of about 20% over a thermoelectric device in the absence of an applied magnetic field. This has a number of advantages as can be seen by those skilled in the conditioned air product market.

The construction of the heat sinks has also been found to dramatically increase the efficiency of heat transfer. By dramatically increasing the surface area for heat transfer by at least one of serpentine fins, if not longitudinal grooves, $\Delta Ts$ of 60F with the same operating conditions.

Specifically, a cooler, a heat pump, heater or air conditioning can be provided which utilizes about a similar BTU per hour output now has a higher efficiency than before and makes the use of this invention more usable for such. In a bench test, the EER registered efficiencies believed to be well above the 8 EER required by current manufacturing standards.

BRIEF DESCRIPTION OF THE DRAWINGS

The particular features and advantages of the invention as well as other objects will become apparent from the following description taken in connection with the accompanying drawings in which.

DETAILED DESCRIPTION OF THE PREFERRED EMBODIMENT

Figure 1:
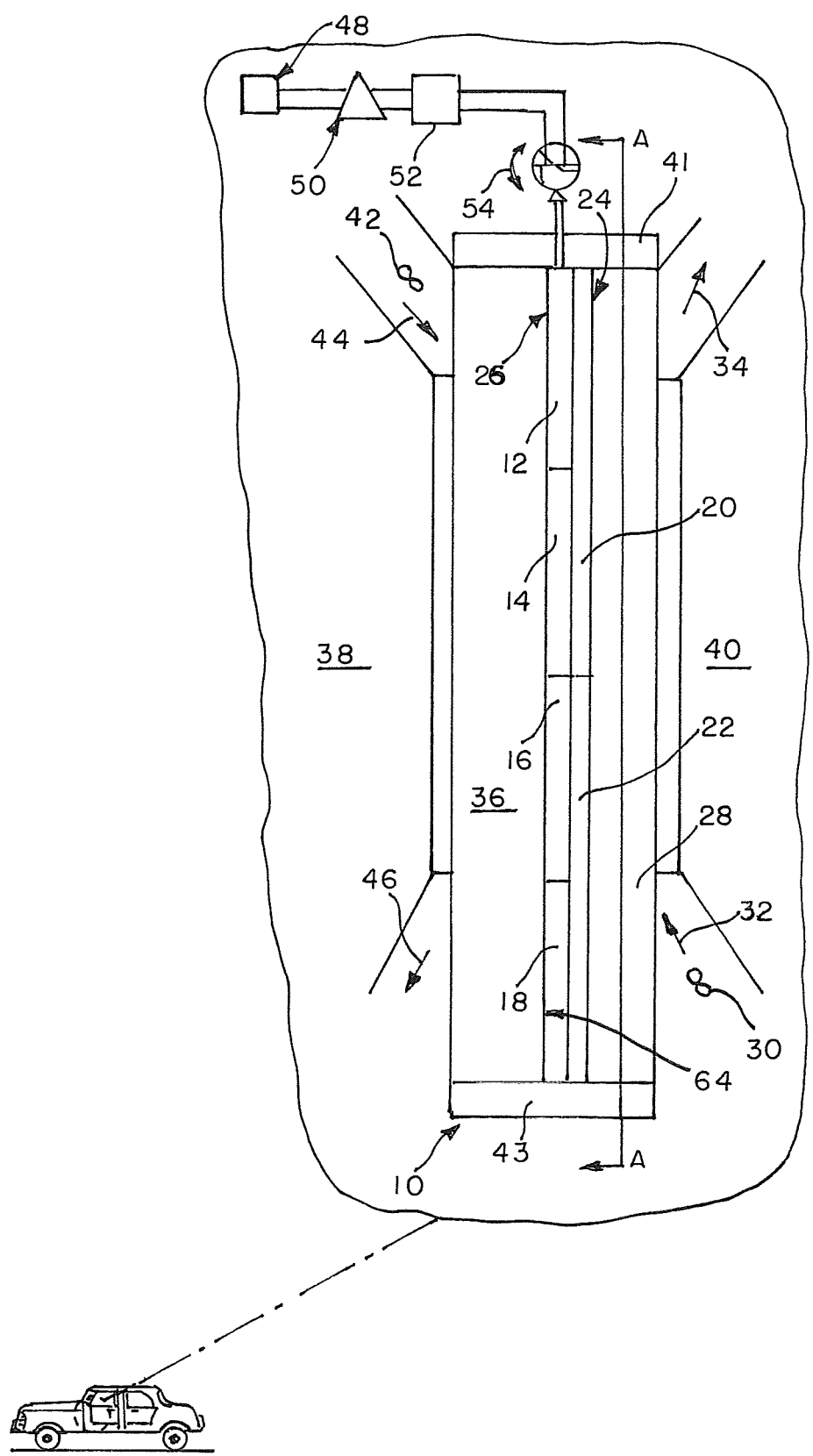
FIG. 1 is a diagrammic representation of an air treatment system of the presently preferred embodiment.

FIG. 1 shows a heating and/or cooling system 10 of the presently preferred embodiment in the form of a heat pump which could also be an air conditioner, heater or cooler depending on the particular application. Heating and/or cooling system 10 preferably comprises one or more thermoelectric devices also known as Peltier devices 12,14,16, 18 which may be electrically connected in series or otherwise and/or may be provided as a single Peltier device having desired dimensions and/or capabilities.

The prototype built by the applicant 2 utilized devices 12,14,16,18 having dimensions of approximately 1½"× 1½"×¼" connected in series. Thermoelectric devices are not new in the art. In fact, they are believed to have been around for well over twenty years. Patents such as U.S. Pat. No. 6,304,741 show an improvement. U.S. Published Patent Application No. 2009/0133409 shows an application. Both of these documents are incorporated by reference. FIG. 1 of Published Patent Application No. 2009/0133409 and its accompanying description show how a thermoelectric cooling device also referred to as a Peltier device operates.

Figure 5:
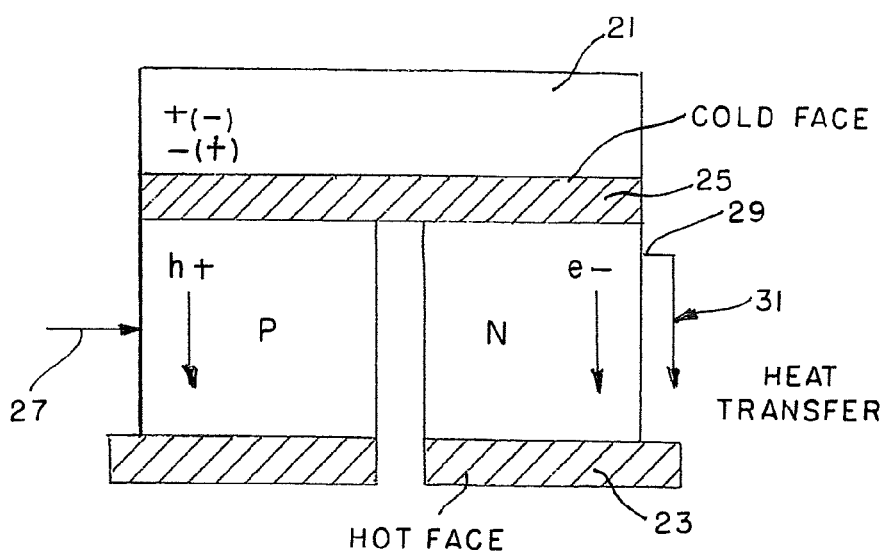
FIG. 5 is a diagrammic representation of the magnetic assist principle in operation.

Current is provided typically a solid state device often having a first P-type semiconductor and a second N-type semiconductor where an electron has a charge carrier. Current from a power supply is passed through the N-type semiconductor to the P-type semiconductor. As current passes in that direction as shown in FIG. 5 and described in Published Patent Application 2009/0133409, heat is removed from a cold face and transferred through the thermoelectric device and deposited to the second surface opposite the first surface causing a build up of heat which is generated at the surface.

In operation, these devices are typically utilized to cool super computer components. Traditionally, they are not particularly efficient. In fact, a Wikipedia article at "thermoelectric cooling" describes the performance as being only around five and ten percent efficient as the ideal refrigerator (Carnot Cycle) as compared to forty to sixty percent achieved by a conventional compression cycle system. This would not normally make a particularly attractive option for heating and cooling except under certain conditions.

Various Peltier unit constructions can be used as thermoelectric devices 12,14,16,18. Some have greater Electron-Hole pair density than others and can be more efficient than the standard Bismuth construction of many Peltier units now in production. Additionally, newer technology includes a process of thin film production that can provide similar efficiency at 1/13 of the size. Some of these style units may be able to increase efficiency up to or exceeding ten or more times.

Atoms in metals are believed to contribute or donate up to or at least one free electron for conduction in metal. In fact, a cubic centimeter (cm3) of metal is believed to have free electrons on the order of about 1022. At temperatures around 20 degrees Centigrade, a cubic centimeter of pure germanium is believed to have about 4.2×1022 atoms and 2.5×1013 free electrons as well as 2.5×1013 holes. Adding 0.001% arsenic has been found to donate another 1017 free electrons in the same volume while simultaneously increasing the electrical conductivity roughly about 10,000 times. Although the test units utilized produced excellent results, additional testing will likely yield additional materials/semiconductors which, when tested for efficiency, are likely to provide even more optimum results than those achieved by the applicant to date.

A further search of Wikipedia for "Energy bands and electrical conduction." "Holes; electron absence as a charge carrier," "Energy-momentum dispersion," "Carrier generation and recombination," "Semi-insulators," "Doping," "Dopants," "Carrier Concentration," "Effect on band structure," and "Preparation of Semiconductor materials" can be helpful to better understand the physics behind Peltier devices used as thermoelectric devices 12,14,16,18.

The applicant has discovered that by placing a magnetic field that is illustrated with magnets 20,22 which are preferentially positioned externally relative to the thermoelectric devices 12,14,16,18 to facilitate flow of electrons the efficiency of cooling or heating can be greatly increased. Of course, a single magnet could be utilized in place of magnets 20,22 and/or additional magnets could be utilized. By being external, the magnets 20,22 and thermoelectric devices can be off the shelf components for some embodiments.

For some embodiments, it is preferable that the magnetic orientation of magnets 20,22 be oriented to facilitate desired electron transfer. Inverting the field has been found to hinder the transfer of electrons and provides a system which decreases the efficiency of the thermoelectric devices 12,14, 16,18. The magnet 21 in FIG. 5 may need to be oriented with its negative face either upwardly or downwardly for efficient operation. One should quickly discover the correct orientation.

As illustrated in FIGS. 1 and 5, the positive end of the magnet 20 can be oriented toward side 24. Negative end of magnet 20 may be oriented toward the side 26 of thermoelectric device 12 (or vice versa depending upon which direction helps). It has also been found helpful that the area of the magnets 20,22 extend over the surface area 12,14,16, 18, however, this may not be the case in all embodiments. The applicant utilized ceramic magnets advertised as having the strongest Ceramic flux and a thickness of 3/8" and has covered the side surface areas of thermoelectric devices 12,14,16,18 and the others which were employed in a prototype device. If a neodymium magnet or other higher flux magnets were employed, it may not be necessary to provide a complete coverage of the cross sectional area of the thermoelectric devices 12,14,16,18 as is done with the prototype and others. Accordingly, with electron flow following from the P semiconductor to the N semiconductor (or visa versa) of the cold face of the thermoelectric device 12 oriented towards the magnet 20 toward the side 24, the facilitation of electron flow has been found to be greatly facilitated. Less current at a given voltage provides a desired ΔT (change in temperature). Hot face 23, cold face 25, P and N semiconductors 27,29. Heat transfer 31 is shown in FIG. 5.

Magnets 20,22 are illustrated as ceramic permanent magnets but other magnets could be utilized including non-permanent magnets (i.e., those magnetic fields caused selectively induced current). Other magnet fields could be provided to facilitate desired transfer of electrons through the thermoelectric devices 12,14,16,18 and or others to provide a desired temperature range. The magnets 20,22 are shown in magnetically coupled to the thermoelectric devices 12,14,16,18 and in fact, are in direct contact therewith. Air pockets would likely provide undesired insulating effects. Heat transfer facilitating sealants may also be utilized to assist in joining the magnets 20,22 to the thermoelectric devices 12,14,16,18.

By providing ceramic magnets, the applicant has discovered that the ceramic magnets themselves are particularly good thermal conductors and assist in transferring the heat through the magnets 20,22 to first heat exchanger or sink 28. A flow of air may be directed along second heat sink 28 as illustrated by the rotation of fan 30 directing air flow 32 onto second heat sink 28 and exhausting at duct 34 outside of a conditioned space 38. Details about a preferred second heat sink 28 will be discussed in further detail below.

Meanwhile, second heat exchanger or first heat sink 36 is preferably employed to assist in directing the other of the hot and cold sides of the Peltier or thermoelectric devices 12,14,16,18 to a space 38 for the air to be conditioned. Space 40 is normally insulated from space 38 such as by insulation 42,43 and may be an external environment and/or lead to an external environment. Fan 42 is illustrated directing air flow 44 into heat sink 46 where it then leaves as exhaust 46.

If the side 26 is the cold side, then as air 44 is directed from space 38 past the heat sink 36 it will cool down and be directed out of cooler air 46 as cool exhaust back into the space 38. Meanwhile, the hot side 24 of the Peltier device 12,14,16,18 directs heat through the heat sink 28 which contacts air 32 from space 40 and exhausted out as exhaust 34 (outside of space 38). Sizing of the fans 32,42 can be provided as necessary.

The applicant discovered that two 1/25 horsepower fans 30 drawing 0.75 amps, each operating at 2700 RPM could provide a hundred cubic feet per minute each of air on the heated side while a single fan 42 of similar capability could provide on the cooling side. With an ambient temperature of approximately 77 degrees (Fahrenheit), the exhaust air 34 was found to be about 99 degrees while the cool air 46 was found to be at about 57 degrees thereby providing a ΔT of roughly forty-two degrees F. in one tested embodiment. A ΔT of 60 has been achieved using the heat sink 28,36 on each of the hot and cold fans 23,25 as described below under similar conditions.

Drawing approximately 3 amps of current BTU per hour could be calculated as 100 cubic feet per minute times 1.08 times ΔT of 20 (F) thereby providing a roughly 2000 BTUs per hour at the cold side and roughly 4000 BTUs per hour on the hot side. Not only is this believed to be highly competitive with compressor based systems, it is believed to be more efficient.

Furthermore, as electricity is normally provided to houses in a 120/240 volt format such as could be represented by supply 48, rectifier(s) 50 can be provided along with one or more capacitors 52 to provide a desired voltage. Also, a switch 54 is employed to select which direction current is provided to the thermoelectric devices 12,14,16,18 and/or others to determine whether or not the space 38 will be cooled or heated. In this manner, the heating and/or cooling device system 10 could be a heat pump. In alternative embodiments, a switch 54 may not be provided and the device may function strictly as an air conditioner, and/or heater, and/or cooler.

Figure 2:
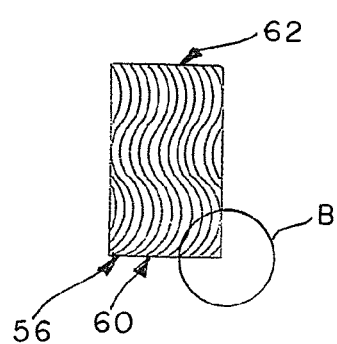
FIG. 2 is a cross sectional view of a heat sink taken along the line A-A of FIG. 1 of the presently preferred embodiment.
Figure 3:
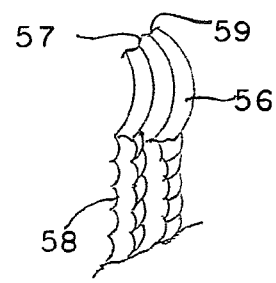
FIG. 3 is a top perspective view of the detail B shown in FIG. 2.

In functions as a heat pump or air conditioner or heater, heat sinks 28 and 36 are preferably employed. Heat sinks 28 and/or 36 may have a configuration such as is shown in FIGS. 2 and 3, namely a serpentine set of fins 56 which may also be provided with longitudinal grooves 58 such as could be provided if a cutting head is wider than its shaft when cut from a block of material as the applicant did for a prototype. This can provide additional surface area. As air is directed through to the heat sinks 28 or 36 such as from bottom 60 to top 62 and or from top 62 to bottom 60. The serpentine feature (over linear fins alone) adds at least approximately 20% more surface area of fins 56 over a fixed length for preferred embodiments. At least 10% is believed to be beneficial in many embodiments. 20% increase in area from serpentine feature alone has been found to reduce the airflow by less than 5%. Furthermore, the surface area can be evaluated by pulling one of the fins 56 and flattening it straight and then comparing it to the length of the serpentine fin.

Additionally, fins 56 can be provided closer together than for many of the prior art heat sinks. For many prior art heat sinks the fin spacing (spacing between fins) is substantially wider than fin. As shown in FIG. 3 the fin spacing 57 as compared to the fin width 59 is roughly about the same. Instead of the prior art fin width being roughly three times or more of the fin width. This feature also adds to the amount of surface area of the heat sink 28,36 as shown in figures for many embodiments.

Furthermore, as can be seen by FIG. 3, the fins 56 can have longitudinal grooves or serrations 58 such as could be created by a ball-end-mill tool so as to provide grooves into the sides of the fin 56 so that the surface area of the fin 56 on both sides is drastically increased to be at least 50% more than a standard planar fin would be. Furthermore, when providing grooves 58 with the serpentine nature 56 of the fins on the closer spacing, the applicant has increased the total surface area of the heat sink 28,36 so as to take a Peltier device normally producing at a ΔT of approximately 20° F. in certain circumstances to a ΔT of 60° F. just by the nature of the heat sink design under identical current and air flow conditions.

The serpentine nature for still other embodiments can increase the length up to 70% without dramatically decreasing the air flow through the heat exchanger.

For many embodiments, the thickness of the fins 56 can be roughly an $1/8^{th}$ to $3/16^{th}$ inches thick or other thicknesses with the spacing 57 being roughly the same. In such a manner, a one inch cross section could typically have four or five fins 56 per inch across the heat sink with a similar number of valleys represented by spacing 57 therebetween adjacent fins 56.

Meanwhile, the height of the fins as extending away from the heat sink 28,36 could be roughly about an inch, or any other height, but an inch has been found to work particularly well for at least some embodiments. Some could be taller such as 3 or 4 inches or any other height as desired for various uses.

Meanwhile, the longitudinal grooves 58 into the side of the fin 56 have been found to at least double the surface area of each side of the fin in many embodiments (100% increase in surface area), and, in fact, for the illustrated embodiment the surface area of the side of the fin is compared to a planar fin is roughly about 3½ times, i.e., greater than 200% and 300%. Accordingly, taken the two together, with the serpentine nature and the longitudinal grooves 58, the total increase in surface area over a similar number of fins with a similar thickness would be about over four times the amount of surface area (over 400%) utilizing the applicant's construction. When coupled with an increased number of fins per cross sectional area, by not having as large of gaps 57 as prior art constructions), even higher surface area can be obtained to assist in the heat transfer.

Selection of the thermoelectric devices 12,14,16,18 may be provided relative to the desired ΔT to be provided across the devices. Efficient heating and/or cooling systems 10 can be provided.

Furthermore, the heat sink 36 may be manufactured so that a portion of the Peltier device 12,14,16,18 extends from side 64 to meet with a second cooperating portion. This works particularly well as the first cooperating portion is compromised of copper as one of ordinary skill in the art can understand. Other first cooperating portions could also be provided. The most common second half portion could be bismuth, titanium or other materials and/or alloys could be employed.

Magnets 20,22 could be integrally formed with heat sink 28 in various embodiments. Heat sink 28 could be formed of ceramic and/or other materials.

Figure 4:
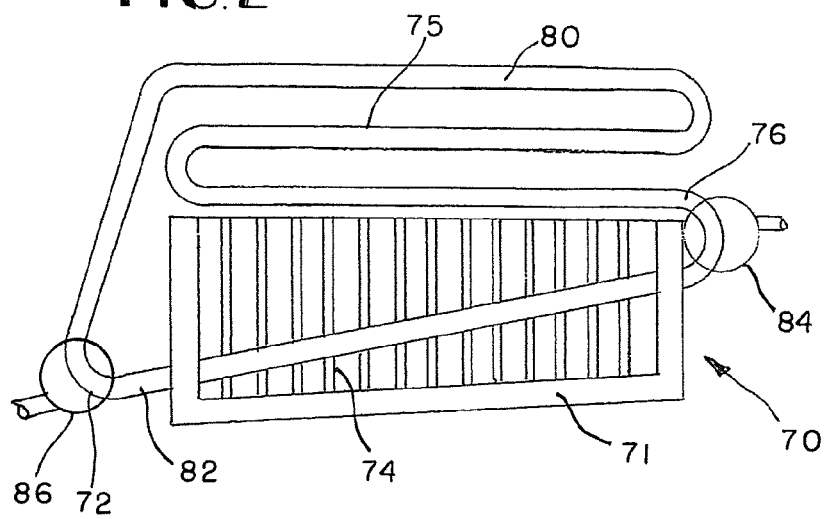
FIG. 4 is an alternative preferred embodiment of the heat sink as is shown in FIG. 1.

FIG. 4 shows an alternative heat sink 70 which could be utilized for heat sink 28 with cooling air 26 provided. Specifically, fluid may be transported through conduit 72 which would be heated by heat sink 70 possibly utilizing one or more fins 74. Copper or other rings are spaced away from heat source side 71 such as shown. Fluid may pass through one or more rings illustrated as rings 76,78,80 in which air or other heat sink could quickly cool. The fluid would then be directed back to start 82 to begin the process again. Valves 84,86 could be employed in some embodiments to direct hot water to a water heater so that waste heat could be utilized to heat water for residential or commercial applications while cooling space 38. Hot water could be directed with valve 84 and return water with valve 86. Other alterations could be employed for other embodiments.

The applicant is unaware of any prior art attempt to employ convection to cool input air 44 to provide cooler air 46 for space 38 utilizing a heat sink 36 in spite of numerous efforts have been utilized to employ a heat sink on the hot side of a Peltier device while directly cooling by conduction with the cold side. Although two fans 30,42 are illustrated, the same motor cold drive both fans 30,42 as is commonly done with window air conditioners as would be understood by those of ordinary skill in the art. Other embodiments may utilize multiple motors.

While a conditioned air system 10 is illustrated, it may be possible for various other embodiments to utilize the technology shown and described herein as a heater such as to heat a cooking article or other object. A plate (not shown) could be placed either at side 24 or the opposite side of heat sink 28. Other embodiments could provide a cooler such as at side 24 or 26 in direct contact with an article to be cooled for conductive heat transfer. Alternatively, the article to be cooled could be adjacent a heat sink 28,36 if employed as would be understood by one of ordinary skill in the art for convection and/or conductive heat transfer.

As opposed to traditional compressor based systems, the applicant believes that with the magnetic assist, significantly higher efficiency is achieved over prior art devices therefore making the use of Peltier devices 12,14,16 and/or 18 comparable with if not more efficient than compressor based devices. Furthermore, in vehicle applications the user may be able to remotely activate the heating and/or cooling device 10 thereby providing conditioned air in the vehicle interior before the individual starts the engine which should be a particularly attractive option in hot and/or cold climates.

This technology is believed to be applicable at least in commercial, industrial and/or residential building applications. Other applications include various vehicles including automobiles, trucks, trains, airplanes, agricultural equipment, boats, recreational vehicles and others. Other applications are believed to exist as well.

Numerous alterations of the structure herein disclosed will suggest themselves to those skilled in the art. However, it is to be understood that the present disclosure relates to the preferred embodiment of the invention which is for purposes of illustration only and not to be construed as a limitation of the invention. All such modifications which do not depart from the spirit of the invention are intended to be included within the scope of the appended claims.

Having thus set forth the nature of the invention, what is claimed herein is:

1. A method of using a thermoelectric cooling system as an HVAC system for use with vehicles comprising the steps of:
   (a) providing a thermoelectric device configured to be connected to a power source, said thermoelectric device connected to a first heat sink on a first side of the thermoelectric device, said first sink having multiple parallel serpentine oriented fins defining multiple parallel serpentine spacings there between, said fins extending in a first direction of airflow;
   (b) energizing the thermoelectric device thereby transferring heat across the thermoelectric device;
   (c) directing a first air flow intentionally to be conditioned by the thermoelectric device in the first direction of airflow as conditioned air directed to a conditioned space thereby one of heating and cooling the space with the first air flow proceeding serpentinely through the spacings between the fins.

2. The method of using the thermoelectric cooling system of claim 1, further comprising the step of having multiple parallel longitudinal grooves in sides of the fins of the first heat sink.

3. The method of using the thermoelectric cooling system of claim 1 further comprising a second heat sink on a second side of the thermoelectric device opposite the first side, said second heat sink having multiple parallel serpentine oriented fins defining multiple parallel serpentine spacings there between, said fins extending in a second direction of airflow;
   and directing a second air flow intentionally to be conditioned by the thermoelectric device in the second direction of airflow as conditioned air directed to a conditioned space thereby one of heating and cooling the space with the second flow proceeding serpentinely through the spacings between the fins.

4. The method of using the thermoelectric cooling system of claim 3, further comprising the step of having longitudinal grooves in sides of the fins of the second heat sink.

5. A method of using a thermoelectric cooling system as an HVAC system for use with vehicles comprising the steps of:
   (a) providing a thermoelectric device configured to be connected to a power source, said thermoelectric device connected to a first heat sink on a first side of the thermoelectric device, said first heat sink having multiple parallel fins defining multiple parallel serpentine spacings there between, said fins extending along a first direction of airflow, said fins having longitudinal grooves in sides of the fins;
   (b) energizing the thermoelectric device thereby transferring heat across the thermoelectric device;
   (c) directing a first air flow intentionally to be conditioned by the thermoelectric device in the first direction of airflow as conditioned air directed to a conditioned space thereby one of heating and cooling the space with the first air flow proceeding serpentinely through the spacings between the fins.

6. The method of using the thermoelectric cooling system of claim 5 further comprising a second heat sink on a second side of the thermoelectric device opposite the first side, said second heat sink having multiple parallel fins extending along a second direction of airflow, said fins of the second heat sink having longitudinal grooves.

7. The method of using the thermoelectric cooling system of claim 6, wherein the fins of the second heat sink are parallel serpentine oriented fins perpendicular to the height defining multiple parallel serpentine spacings there between.

8. The method of using the thermoelectric cooling system of claim 6 further comprising the step of directing air flow to contact the fins of the second heat sink.

9. The method of using the thermoelectric cooling system of claim 6 wherein the fins of the second heat sink are serpentine oriented longitudinally along the second direction of airflow to provide multiple parallel spacings in the second direction of airflow, and directing airflow in the second direction of airflow serpentinely through the spacings between the fins.

10. The method of using the thermoelectric cooling system of claim 5 wherein a gap between adjacent fins having longitudinal grooves in the first heat sink is no more than about 1.5 times a width of the fins.

* * * * *